United States Patent [19]
Campbell et al.

[11] Patent Number: 5,670,820
[45] Date of Patent: Sep. 23, 1997

[54] SEMICONDUCTOR ELEMENT INCORPORATING A RESISTIVE DEVICE

[75] Inventors: Richard Norman Campbell, Coed Eva; Michael Kevin Thompson, Maindee; Elizabeth Ann Smith, Malpas, all of United Kingdom

[73] Assignee: Inmos Limited, United Kingdom

[21] Appl. No.: 290,226

[22] Filed: Aug. 15, 1994

Related U.S. Application Data

[60] Continuation of Ser. No. 31,132, Mar. 12, 1993, abandoned, which is a division of Ser. No. 185,140, Apr. 22, 1988, Pat. No. 5,198,382.

[30] Foreign Application Priority Data

May 1, 1987 [GB] United Kingdom ............... 8710359

[51] Int. Cl.$^6$ ............... H01L 29/43; H01C 7/13
[52] U.S. Cl. ............... 257/538; 257/755; 257/757; 257/904
[58] Field of Search ............... 257/538, 904, 257/66, 67, 754–757

[56] References Cited

U.S. PATENT DOCUMENTS

| | | | |
|---|---|---|---|
| 3,590,471 | 7/1971 | Lepselter et al. | 29/571 |
| 3,879,236 | 4/1975 | Langdon | 148/175 |
| 3,902,926 | 9/1975 | Perloff et al. | 437/918 |
| 4,155,778 | 5/1979 | Antipov | 148/1.5 |
| 4,362,597 | 12/1982 | Fraser et al. | 437/192 |
| 4,398,341 | 8/1983 | Geipel, Jr. et al. | 437/944 |
| 4,400,867 | 8/1983 | Fraser | 437/944 |
| 4,451,328 | 5/1984 | Dubois | 437/944 |
| 4,455,547 | 6/1984 | Murakami et al. | 257/538 |
| 4,470,189 | 9/1984 | Roberts et al. | 437/192 |
| 4,558,508 | 12/1985 | Kinney et al. | 437/944 |
| 4,560,419 | 12/1985 | Bourassa et al. | 437/247 |
| 4,604,789 | 8/1986 | Bourassa | 29/576 C |
| 4,767,721 | 8/1988 | Liao et al. | 437/74 |
| 4,949,153 | 8/1990 | Hirao et al. | 257/538 |
| 4,954,855 | 9/1990 | Mimura et al. | 257/347 |

FOREIGN PATENT DOCUMENTS

| | | | |
|---|---|---|---|
| 0078190 | 5/1983 | European Pat. Off. | H01L 21/31 |
| 0112097 | 6/1984 | European Pat. Off. | H01L 21/31 |
| 0145926 | 6/1985 | European Pat. Off. | H01L 21/31 |
| 0159408 | 10/1985 | European Pat. Off. | H01L 21/31 |
| 0192871 | 3/1986 | European Pat. Off. | H01L 21/90 |
| 0167249 | 8/1986 | European Pat. Off. | H01L 21/31 |
| 0029108 | 3/1980 | Japan | 257/538 |
| 0076157 | 4/1985 | Japan | 257/538 |
| 0283153 | 12/1986 | Japan | 257/538 |

OTHER PUBLICATIONS

Patent Abstracts of Japan, Kokai Publication #56–094625, Jul. 1981, vol. 5 No. 167, Yoshitaka.

Mahan et al., "Giaohm—Range Polycrystalline Silicon Resistors for Microelectronic Applications," *IEEE Trans. On Electron Devices* ED–30 (Jan. 1983), pp. 45–51.

Abdel—Motales et al., "A Simple Self–Aligned GaAs MESFET Using Polymide", *Solid State Electronics*, vol. 30, No. 4, pp. 361–363 (1987).

Wolf et al., *Silicon Processing for the VLSI Era, vol. 1: Process Technology*, pp. 57, 326, and 328 (1986).

*Primary Examiner*—Peter Toby Brown
*Attorney, Agent, or Firm*—McDermott, Will & Emery

[57] ABSTRACT

In a semiconductor polycide resistive element having a first region of polysilicon of one conductivity type and second regions of polysilicon of opposite conductivity type, with silicide overlying the polysilicon but not the first region, the edges of the silicide are spaced apart from the boundaries between the opposite conductivity types.

5 Claims, 5 Drawing Sheets

SEMICONDUCTOR ELEMENT INCORPORATING A RESISTIVE DEVICE

This is a continuation of application Ser. No. 08/031,132, filed on Mar. 12, 1993 (now abandoned), which is a divisional of application Ser. No. 07/185,140, filed on Apr. 22, 1988 (now U.S. Pat. No. 5,198,382).

BACKGROUND OF THE INVENTION

The present invention relates to a method of fabricating a semiconductor element, for example, a resistor in polysilicon between two areas of polysilicon in a polycide element. The present invention also relates to a semiconductor element. The present invention has particular application in the fabrication of semiconductor resistors for use in random access memories.

In semiconductor devices such as static random access memories which incorporate memory cells, it is desirable to use silicide, e.g. tungsten silicide, as an interconnect level instead of polysilicon since silicide has higher inherent electrical conductivity and thus permits the fabrication of higher performance devices. One disadvantage of silicide is that it is not possible to control the conductivity of the silicide by doping the silicide with impurities. Consequently, it is not possible to create resistors or diodes in polycide, "polycide" being a term known in the semiconductor fabrication art for a multi-layered structure having a layer of silicide on top of a layer of polysilicon. Another disadvantage of silicide is that when silicide is deposited over polysilicon it contaminates the polysilicon and makes it more highly conductive. If the silicide is subsequently etched away, the underlying polysilicon remains contaminated and cannot be used to fabricate load devices. Accordingly, in order to fabricate load devices in semiconductor devices, which include silicide interconnect, it is necessary to ensure that the silicide is not directly in contact with the load devices.

It is known to provide a static random access memory (SRAM) cell which consists of two pass gate transistors, two cross coupled latch transistors and two load devices. The load devices may be resistors and the SRAM cell may have the configuration which is shown in FIG. 2 of U.S. Pat. No. 4,471,374 which is assigned to Inmos Corporation. Such a memory cell is referred to as a 4T2R SRAM cell since it comprises four transistors and two resistors. However, the 4T2R memory cell does not employ silicide interconnect. An attempt has been made to fabricate a SRAM cell which does employ silicide interconnect and therefore has higher performance. However, due to the disadvantages of silicide described above it was necessary to fabricate the load devices as transistors, rather than resistors, resulting in a six transistor (6T) SRAM cell. This arrangement suffers from the disadvantage that a six transistor SRAM cell has a large area which leads to a reduction in the memory capacity of a memory of prescribed dimensions.

EP-A-0192871 which is in the name of Inmos Corporation discloses a method of forming a polysilicon resistor in a polycide line in which a barrier material isolates a polysilicon resistor from an overlayer of silicide which forms two polycide interconnect regions on opposed sides of the resistor. However, this method has inherent alignment tolerances which results in a memory cell of relatively large size.

Accordingly, there is a need for SRAM cells, which employ silicide interconnect and incorporate load devices, which can be fabricated to a smaller size than the above-described known devices.

EP-A-0167249 which is also in the name of Inmos Corporation discloses a method of fabricating a resistor in polysilicon, the resistor having a structure which electrically resembles back-to-back diodes and is referred to as RABID, RABID being an acronym meaning Rapid Annealed Boron Implanted Diode. The disclosed resistor can be readily fabricated and has a low thermal activation energy. However, there is no teaching of how to incorporate such a RABID structure into a polycide semiconductor element.

Accordingly, there is also a need for RABID load devices in polycide semiconductor elements.

In Solid State Electronics, Volume 30, No. 4, pp. 361–363, 1987, I. Abdel-Moteleb and L. Young disclose a self-aligned gate process for fabricating a GaAs MESFET using a polyamide layer. However, that article does not relate to semiconductor elements employing silicide interconnect.

SUMMARY OF THE INVENTION

The present invention provides a method of fabricating a polycide semiconductor element, the method including the steps of:

(a) forming a lift-off mask on a first region of a layer of polysilicon;

(b) implanting a first dopant into second regions of the polysilicon which are adjacent the first region, the first region being masked from implantation by the lift-off mask;

(c) forming a layer of silicide over the implanted regions and the lift-off mask; and (d) removing the lift-off mask and the respective part of the layer of silicide which is formed thereover thereby to expose the first region.

The polysilicon may be initially doped with a second dopant of one polarity. Alternatively, a second dopant of one polarity is implanted into the first region after removing step (d).

The first dopant may be of opposite polarity to the second dopant, and desirably, the first dopant is an n-dopant and the second dopant is a p-dopant.

The method may further comprise the step of annealing the silicide at an elevated temperature, the annealing step causing diffusion of the first dopant into the first region thereby to form a resistive device in the first region.

In a first embodiment of the present invention the lift-off mask comprises a lower layer of polyimide and an upper layer of silicon dioxide.

In a second embodiment of the present invention the lift-off mask comprises a lower layer of silicon oxide and an upper layer of silicon nitride.

The present invention further provides a method of fabricating a resistive device in polysilicon between two areas of polysilicon in a polycide element, the method comprising the steps of:

(a) forming a lift-off mask on a first region of a layer of polysilicon;

(b) implanting an n-dopant into second regions of the polysilicon which are adjacent the first region, such that the second regions have a net excess of n-dopant, the first region being masked from dopant implantation by the lift-off mask;

(c) forming a layer of silicide over the implanted regions and the lift-off mask;

(d) removing the lift-off mask and the respective layer of silicide formed thereover thereby to leave two portions of silicide interconnect between which the first region is located;

(e) doping the first region with p-dopant, the doping being carried out either before forming the lift-off mask in step (a) or after removal of the lift-off mask in step (d); and (f) annealing the silicide at an elevated temperature, the annealing step causing diffusion of the n-dopant from the second regions into respective sides of the first region to form two spaced boundaries between the n- and p-doped regions which are located inwardly of the portions of silicide interconnect.

The present invention still further provides a semiconductor element comprising a silicon substrate, superimposed layers of oxide and polysilicon on the substrate, the polysilicon having a first region and two second regions which are adjacent the first region, each of the second regions having been doped during an implantation step with an implanted impurity of one conductivity type, and two portions of a layer of silicide, each of which portions has been formed on a respective implanted second region during a forming step, the first region having been masked both from the implanted impurity and from the layer of silicide by a lift-off mask.

Preferably, the first region is doped with an impurity of the other conductivity type.

More preferably, the boundaries between the first and second doped regions are located inwardly of the portions of formed silicide and have been positioned by diffusion at an elevated temperature of the impurity of one conductivity type from the second regions into the first region.

The present invention still further provides a semiconductor element comprising a silicon substrate, superimposed layers of oxide and polysilicon on the substrate, the polysilicon having a first region doped with an impurity of one conductivity type between two second regions doped with an impurity of the other conductivity type thereby to form two spaced boundaries between the first and second regions, and two opposed regions of silicide on the polysilicon, each silicide region being disposed on a respective second region and being located outwardly away from the respective boundary thereby to form a resistive device between two areas of polysilicon in a polycide element.

Preferably, the impurity of one conductivity type is a p-dopant and the impurity of the other conductivity type is an n-dopant.

DESCRIPTION OF THE PREFERRED EMBODIMENTS

Embodiments of the present invention will now be described by way of example only with reference to the accompanying drawings, in which.

Figure 1:
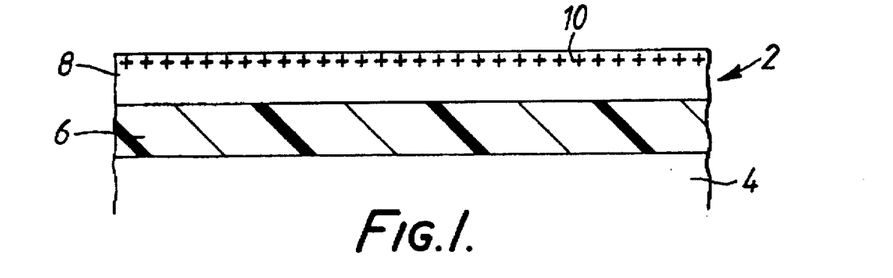
FIG. 1 is a section of part of a silicon wafer structure, including a bottom layer of silicon, an intermediate layer of oxide, and a top layer of polycrystalline silicon (polysilicon) which has been implanted, on which resistive devices are to be made by a method in accordance with a first embodiment of the present invention.

Referring to FIG. 1, a silicon wafer 2 upon which a resistive device such as a resistor is to be formed comprises a bottom layer 4 of silicon, an intermediate insulating layer 6 of silicon dioxide and a top layer 8 of polycrystalline silicon (polysilicon). The upper surface of the polysilicon layer 8 has been implanted with a p-dopant in a known manner thereby to form a p-doped region 10 in the polysilicon layer 8, the p-doped region being represented in the Figures by + signs. Typically, the p-dopant is boron.

Figure 2:
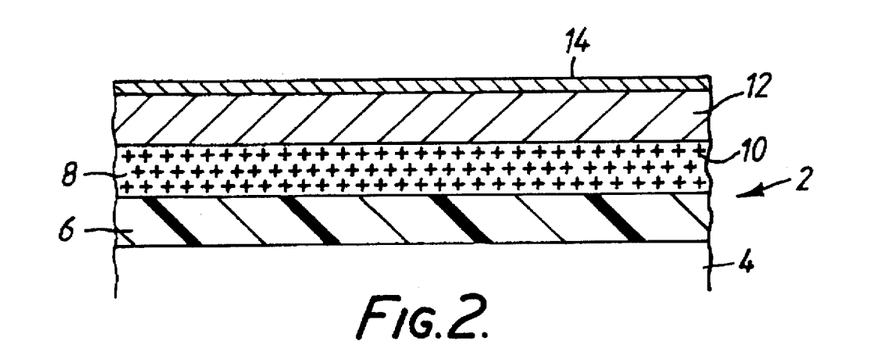
FIG. 2 is a section of the silicon wafer structure, of FIG. 1 after a lift-off layer and a masking layer have been applied successively to the silicon wafer structure.

Referring to FIG. 2, a lift-off layer 12 is then applied over the p-doped region 10 of the polysilicon layer 8. In one preferred embodiment of the present invention, the lift-off layer 12 is a polyimide, The polyimide layer 12 is spun onto the wafer 2 and is then fully cured in a known manner. Subsequently, a masking layer 14 is deposited over the lift-off layer 12. When the lift-off layer 12 is polyimide, the masking layer 14 is preferably a pyrox layer, which has been formed by atmospheric pressure chemical vapour deposition (APCVD) of silicon dioxide. Alternatively, plasma enhanced chemical vapour deposition (PECVD) of silicon dioxide or other suitable materials such as silicon oxynitrate, may be employed to form the masking layer 14. The masking layer 14 is preferably thin relative to the lift-off layer 12.

Figure 3:
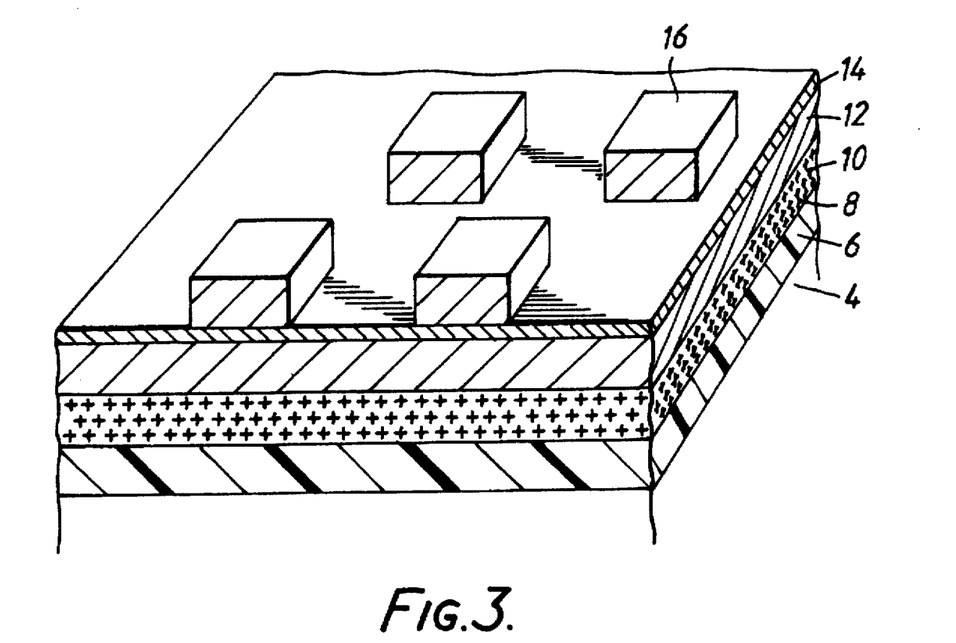
FIG. 3 is a perspective part-sectional view from above of the silicon wafer structure of FIG. 2 after a photoresist has been applied to the masking layer in a desired pattern.

As is shown in FIG. 3, a desired pattern of photoresist layers 16 is then applied over the masking layer 14. The photoresist layers 16 are patterned by conventional patterning techniques e.g. by using a mask. Each photoresist layer 16 is positioned over a respective area of the p-doped region 10 of the polysilicon layer 8 in which a resistor is to be formed.

Figure 4:
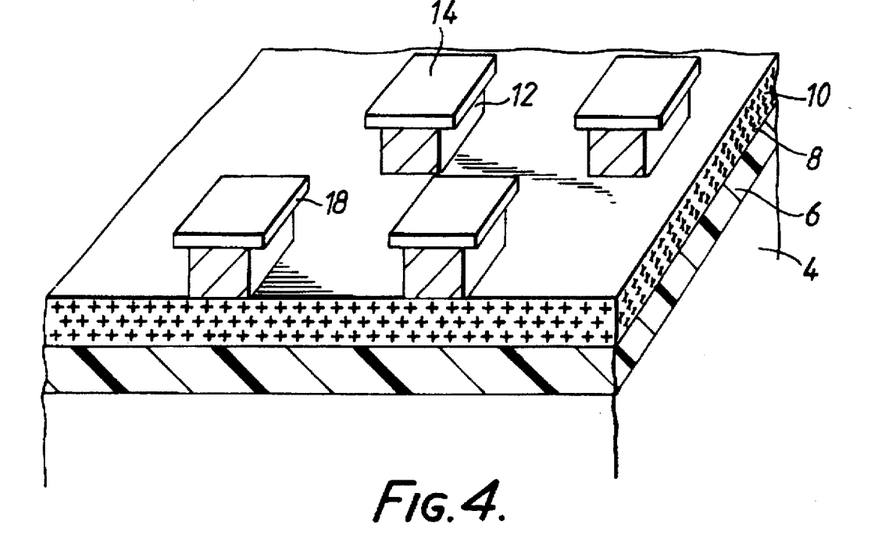
FIG. 4 is a perspective part-sectional view of the silicon wafer structure of FIG. 3 after the masking layer has been etched, the lift-off layer has been etched, and the photoresist has been removed.

The masking layer 14 is then etched whereby those areas of the masking layer 14 which are not coated with the photoresist layers 16 are removed by the etchant. When the masking layer 14 is composed of pyrox, as described above, the etching step is carried out by using a wet hydrogen fluoride based etchant. The lift-off layer 12 is then etched also whereby those areas of the lift-off layer 12 which are not covered by the masking layer 14 are removed by the etchant. When the lift-off layer 12 is composed of polyimide, the etching step is carried out by an oxygen plasma, or, alternatively, a strong oxidizing acid such as nitric acid or sulphuric acid. The etching of the lift-off layer 12 is carefully controlled so that those portions of the lift-off layer 12 which are underneath the edge regions 18 of the masking layer 14 are removed thereby to undercut the edge regions 18 of the masking layer 14 and form an overhang or undercut 19 of the masking layer 14. The undercut 19 forms a re-entrant junction between the masking layer 14 and the lift-off layer 12. The photoresist layers 16 are then stripped away in known manner. The resultant structure is shown in FIG. 4.

Figure 5:
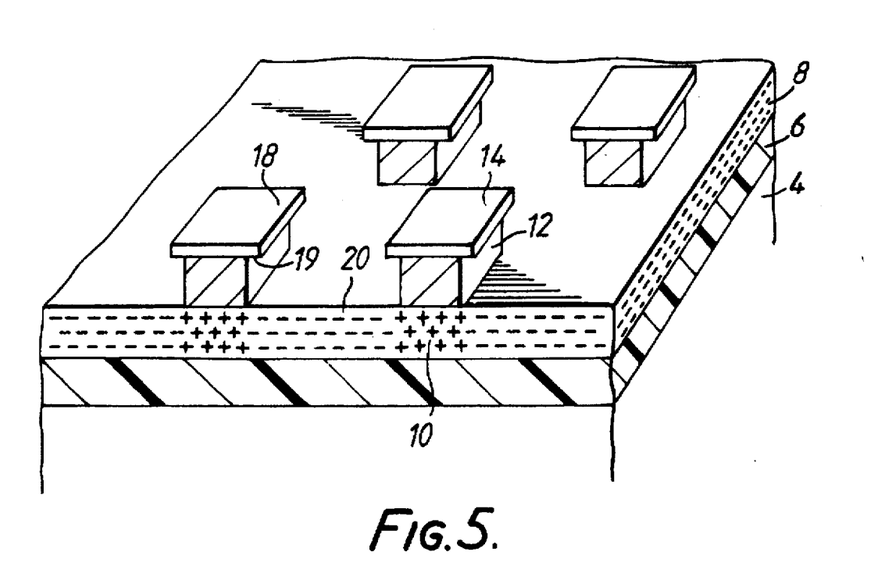
FIG. 5 is a perspective part-sectional view of the silicon wafer structure of FIG. 4 after implantation of a dopant into unmasked portions the polysilicon layer of the wafer.

The next step, as shown in FIG. 5, is the implantation of the structure with an n-dopant such as arsenic or phosphorous. The implantation direction is preferably normal to the masking layer 14 and the polysilicon layer 8. The masking layer 14, and also the lift-off layer 12, acts as a mask during the implantation step whereby those regions of the polysilicon layer 8 which are covered by the masking layer 14 are not implanted with n-dopant. The surrounding regions of the polysilicon layer 8 are implanted with n-dopant, and the implantation is controlled such that the n-dopant concentration exceeds the initial p-dopant concentration whereby the surrounding regions have a net n-dopant concentration. The n-doped regions 20 are indicated in FIG. 5 by − signs. It may be seen from FIG. 5 that the pattern of doped regions of the polysilicon layer 8 corresponds to the pattern of the masking layers 14.

Figure 6:
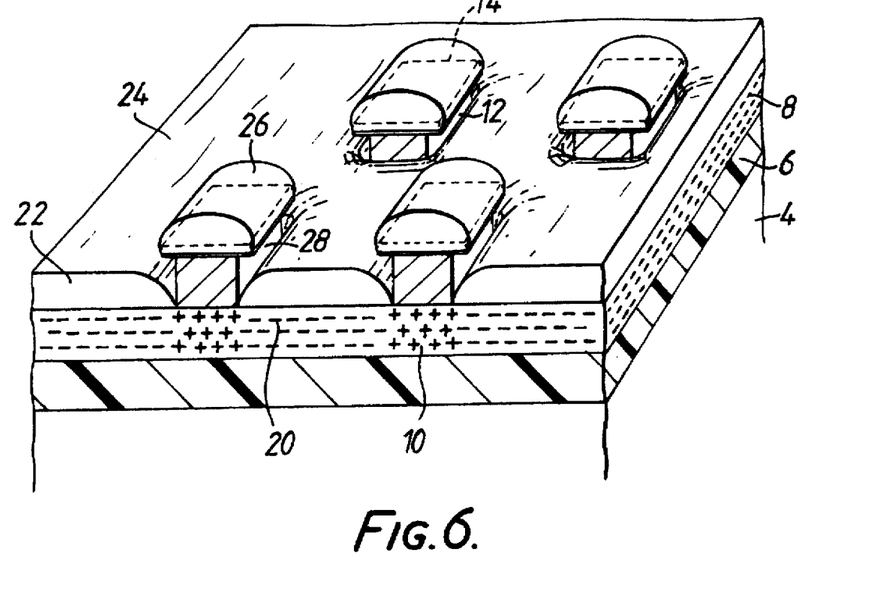
FIG. 6 is a perspective part-sectional view of the silicon wafer structure of FIG. 5 after deposition of silicide.

Referring to FIG. 6, a layer of silicide 22, such as tungsten silicide or titanium silicide, is then formed over the masking layers 14 and the n-doped regions 20 of the polysilicon layer 8. This forms "polycide" structures consisting of a layer of silicide on top of a layer of polysilicon. Preferably, tungsten silicide is deposited by chemical vapour deposition at a temperature of around 350° C. as this tends to give good stoichiometery in the tungsten silicide with a well controlled W/Si ratio. The silicide layer 22 must be deposited at a relatively high temperature, e.g. 350° C. and so the masking layer 14 and the lift-off layer 12 must be composed of materials which do not degrade at such elevated temperatures. It is for this reason that the masking layer 14 may be composed of pyrox instead of a conventional photoresist as such a photoresist would degrade at such temperatures. Similarly, the polyimide is chosen since it is thermally stable. The depth of the deposited silicide layer 22 is carefully controlled so that the major portion 24 of the silicide layer 22 which is formed on the polysilicon layer 8 is not contiguous with those portions 26 of the silicide layer 22 which are deposited on the masking layers 14 so that each portion 26 of the silicide layer 22 is separated from the major portion 24 by a gap 28. The retention of the gap 28 is aided by the re-entrant junction between the masking layer 14 and the lift-off layer 12. The major portion 24 of the silicide layer 22 extends up to the lower edge of the lift-off layer 12.

Figure 7:
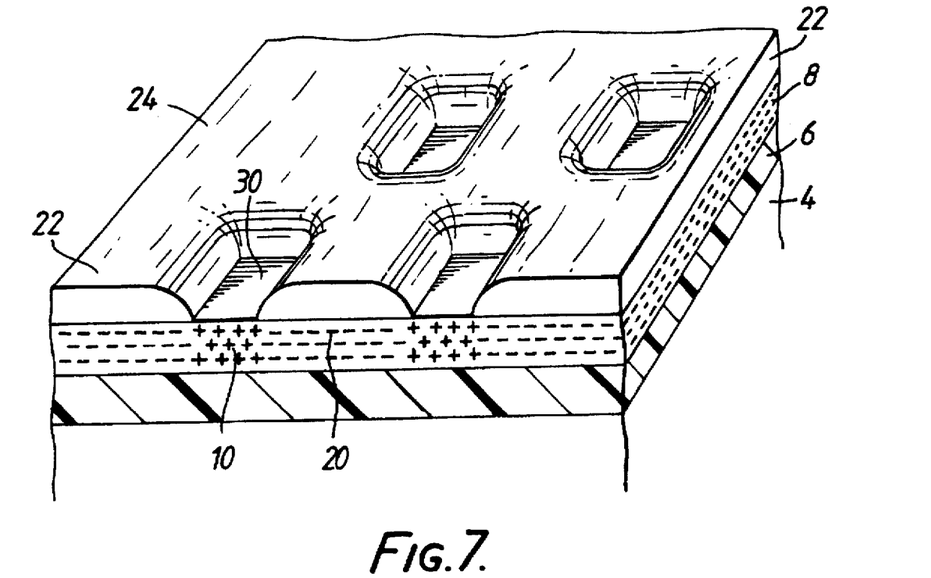
FIG. 7 is a perspective part-sectional view of the silicon wafer structure of FIG. 6 after removal of the lift-off layer.

The lift-off layer 12 is then removed by etching. When the lift-off layer 12 is composed of polyimide, the etchant is a strong oxidizing acid, such as nitric acid or sulphuric acid, or a hot solvent which dissolves the polyimide. Removal of the lift-off layer 12 also removes the masking layer 14 and the portion 26 of the silicide layer 22 which is deposited on the masking layer 14. The resultant structure is shown in FIG. 7. It will be seen that the upper surface of the silicon wafer 2 consists of a layer of silicide 22 with individual exposed regions 30 of p-doped polysilicon 10.

Figure 8:
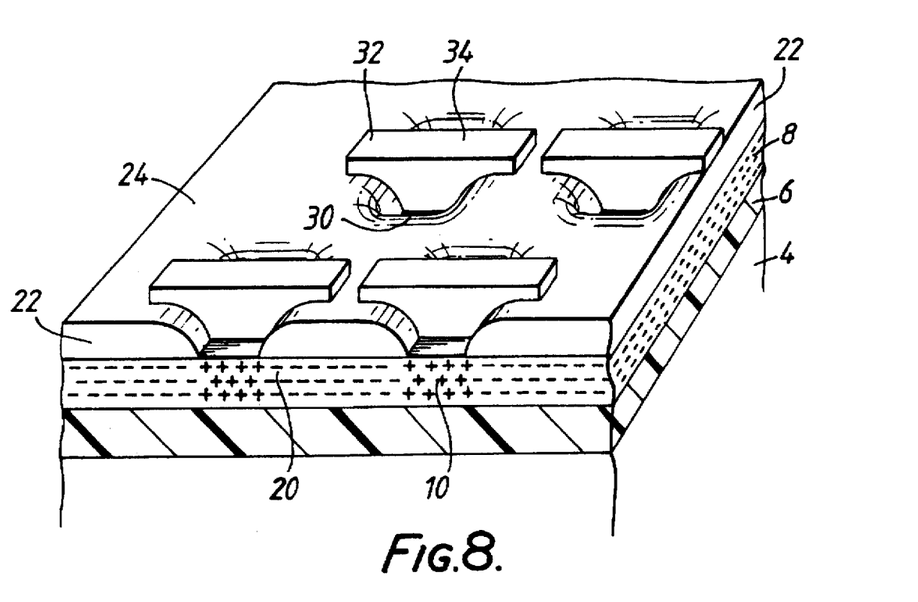
FIG. 8 is a perspective part-sectional view of the silicon wafer structure of FIG. 7 after deposition and patterning of a photoresist layer.

Referring to FIG. 8, a second photoresist layer 32 is then deposited over the silicon wafer 2 and exposed and developed in a conventional manner thereby to pattern the photoresist layer 32. Each exposed region 30 of p-doped polysilicon is bridged transversely by a portion 34 of the developed photoresist layer 32 which extends between opposed parts of the silicide layer 22.

Figure 9:
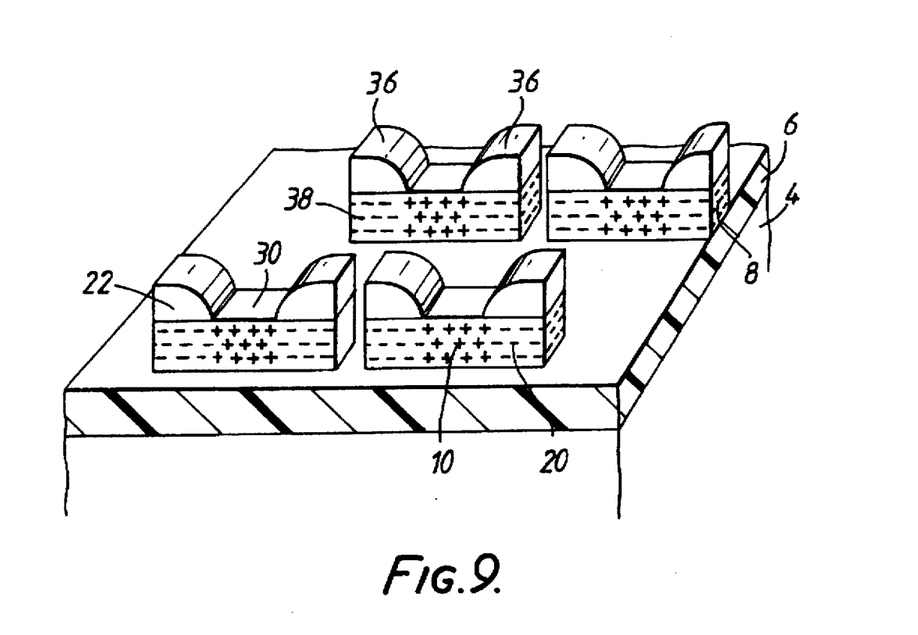
FIG. 9 is a perspective part-sectional view of the silicon wafer structure of FIG. 8 after etching of the exposed silicide and polysilicon and removal of the photoresist layer.

The exposed parts of the silicide layer 22 and the polysilicon layer 8 which are not covered by the photoresist layer 32 are then etched away, e.g. by a plasma of fluorine and chlorine in combination. The photoresist portions 34 are then removed in known manner. The resultant structure is shown in FIG. 9. It will be seen that the etching step leaves a plurality of opposed pairs of silicide portions 36, each pair being disposed over a respective strip 38 of polysilicon which is deposited on the insulating oxide layer 6. The strips 38 of polysilicon are separated from each other and electrically insulated from each other by the insulating oxide layer 6. Each pair of silicide portions 36 is separated by a p-doped polysilicon region 10 and each silicide portion covers an n-doped polysilicide region 20. The p- and n-doped regions 20, 10 are separated by a boundary.

Figure 10:
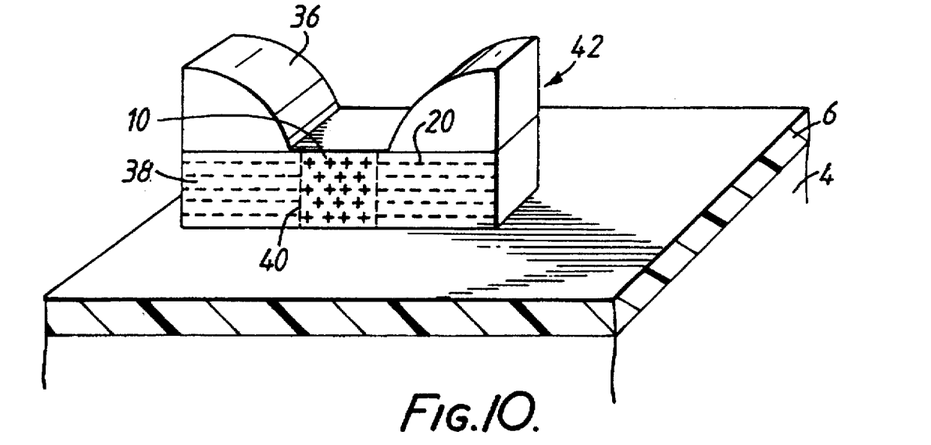
FIG. 10 is an enlarged perspective view of one of the polycide assemblies on the silicon wafter structure of FIG. 9 after annealing of the silicide and formation of the resistive devices.

FIG. 10 shows a resultant resistor 42 which has been formed by rapidly annealing the wafer structure 2 at an elevated temperature, typically around 1000° C. The annealing step causes diffusion of the n-dopant (e.g. arsenic) in the polysilicon portions 38. This causes the boundaries 40 between the p-doped polysilicon region 10 and the n-doped region 20 to move inwardly towards each other due to diffusion of n-dopant into the p-doped region 10. The boundaries 40 thus move away from the silicide portions 36. The annealing step is controlled so that the boundaries 40 are located inwardly of the opposed silicide portions 36 by a predetermined offset. The annealing step also anneals the silicide. It will be seen that each resultant resistor consists of a pair of electrically conductive silicide portions 36 which are connected by, in turn, a first n-doped region 20, a p-doped region 10 and a second n-doped region 20, these regions forming an arrangement somewhat like NPN back-to-back diodes which can function as a resistor of high value (e.g. about $1 \times 10^9$ ohms). Each diode may be called "RABID" which is an acronym meaning "Rapid Annealed Boron Implanted Diode". Thus FIG. 10 illustrates a load device which is fabricated using a single layer of polysilicon and a single layer of silicide.

Figure 11:
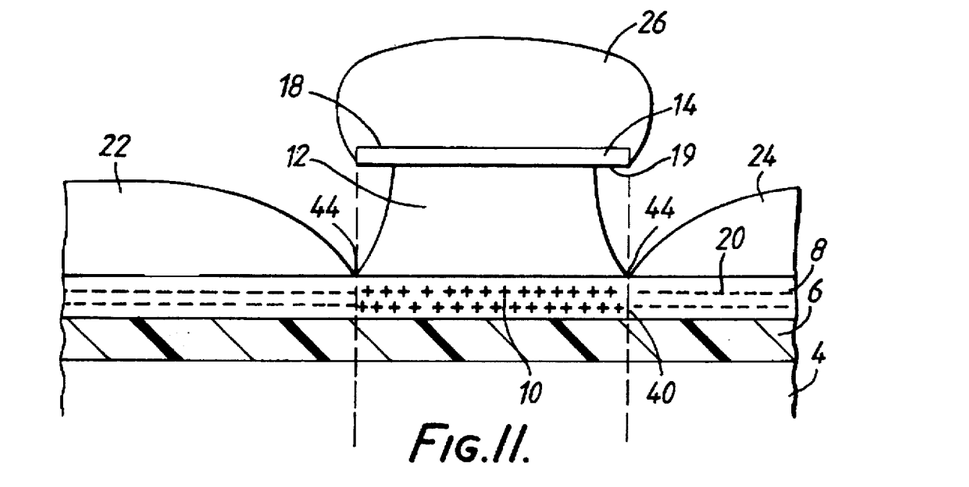
FIG. 11 is a section of part of the silicon wafer structure of FIG. 6 showing how the masking layer prevents deposition of silicide over an area in which a resistive device is to be formed.
Figure 12:
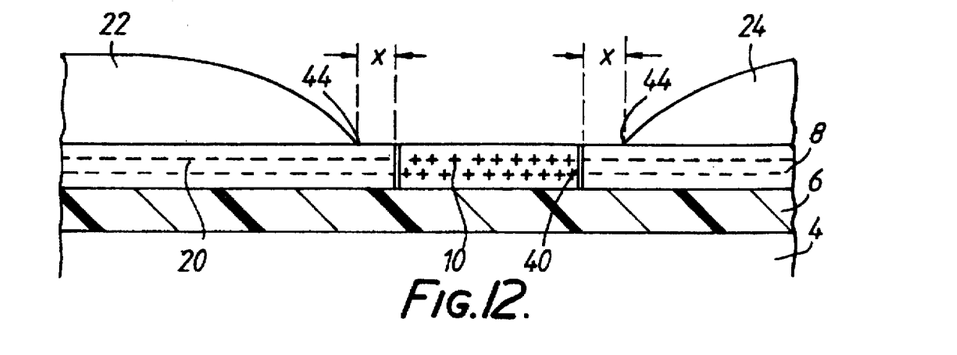
FIG. 12 is a section similar to FIG. 11 of part of the silicon wafer structure of FIG. 10 showing the positional relationship of the resistive device to the remaining silicide deposits.

FIGS. 11 and 12 show less schematically the undercutting of the lift-off layer 12 and also the relationship between the edges of the silicide layer 22 and the doped regions of the polysilicon layer 8. As may be seen from FIG. 11, after deposition of the silicide layer 22 to form polycide regions around the lift-off layer 12, the edge of the masking layer 14 defines the initial boundaries 40 between the p- and n-doped regions 10, 20 and also the edges 44 of the silicide layer on the polysilicon layer 8. This is because the masking layer 14 not only acts as a mask during the n-dopant implantation step when the n-dopant is implanted to form the n-doped regions 20 which are adjacent the p-doped regions 10 but also acts as a mask during the silicide deposition step. Typically, the lift-off layer 12 is 3000–4000 angstroms thick, the masking layer 14 is about 1000 angstroms thick and the silicide layer 22 is about 2500 angstroms thick. The undercut 19 is typically 3000 angstroms in width. It will of course be understood that for the sake of clarity of illustration, the dimensions of the various layers in the Figures are not shown to scale. After the annealing step, as shown in FIG. 12, the boundaries 40 have diffused inwardly towards each other, whereby the p-doped regions 10 are spaced from the silicide layers 22 by the offset X. This prevents the back-to-back diodes from being shorted out by the silicide and ensures that the resistor functions reliably.

In an alternative preferred method, the polysilicon layer 8 is not initially implanted with a p-dopant to form a p-doped region 10. Instead, the lift-off layer 12 is applied to the polysilicon layer 8 without a pre-doping step. After the lift-off layer 12 has been removed by etching to expose the regions 30 of polysilicon, a p-dopant such as boron is implanted into those regions 30. The silicide layer 22 acts as a mask during the implantation step and prevents implantation of the p-dopent into the n-doped regions of the polysilicon.

In further alternative arrangements, the annealing step need not be the last step of the method. The annealing may be carried out at any stage after the n-dopant implantation step if the lift-off layer 12 is thermally stable at the annealing temperature and, when the lift-off layer 12 is not thermally stable at the annealing temperature, after the lift-off layer has been etched away.

It should be understood that whilst the illustrated embodiment of the present invention employs n- and p-dopants, the polarity of the dopants can be the same as well as different. Also, when the polarity of the dopants is different, the polarity of the doped areas may be reversed.

In accordance with a second embodiment of the present invention, the lift-off layer 12 is composed of a silicon oxide film which is grown or deposited on top of the polysilicon layer 8 and the masking layer is composed of a thin silicon nitride film which is then grown or deposited on top of the oxide film. In the etching of the masking layer 14 of silicon nitride, a fluorine plasma is employed as a dry etch and the lift-off layer 12 of silicon oxide is etched with wet hydrogen fluoride-based etchant. Alternatively, layers 12 and 14 may be etched by a plasma etchant e.g. a fluorinated hydrocarbon, in a single etching step. This single etching step can also be extended to recess the silicide into the polysilicon such that there is no step at the structure boundary. This improves the planarity of the resultant device. Furthermore, the annealing step may be carried out after the n-dopant implantation step, as the masking and lift-off layers of nitride and oxide would not be thermally degraded during the annealing step. The use of silicon oxide as the lift-off layer 12 is less expensive than the use of polyimide, but the polyimide layer tends to have fewer defects than the oxide layer leading to a more reliable production process.

Although for the sake of clarity the Figures illustrate the fabrication of a number of discrete resistors formed on a silicon wafer, it will be readily understood by those skilled in the art that, in practice, the resistors would be incorporated into semiconductor devices such as SRAM cells and would be connected to other semiconductor elements in those devices. For example, two of the illustrated resistors may be connected together in known fashion by an interconnect layer e.g. of silicide or metal, and those two resistors may be incorporated in a 4T-2R SRAM cell.

The present invention has particular application in the formation of resistive loads between silicide interconnect in a semiconductor memory device. Specifically, in a particularly preferred embodiment of the invention the resistive loads are present in memory cells of a semiconductor chip, the memory cells being static random access memory (SRAM) cells having four transistors and two resistors (4T-2R SRAM cells). The SRAM cell consists of two pass gate transistors, two cross coupled latch transistors and two load devices. The present invention can be used to fabricate the two load devices thereby to form a 4T-2R SRAM cell with a single layer of polysilicon, a layer of silicide, and using RABID junction loads.

The process of the present invention leads to a number of distinct advantages over the known processes for producing load devices in SRAM cells.

A primary advantage is that the position of the silicide interconnect regions are self-aligned relative to the load devices since the single masking layer 14 is used to mask the load device both during the n-dopant implantation step and during the silicide deposition step. The load device is formed in an area of the polysilicon where silicide is removed together with the stack of lift-off layer/masking layer during the lift-off etch. This self alignment of the silicide interconnect to the load devices leads to optimal utilization of the area of the memory cell which is required for the load devices. In the design of a semiconductor memory device, minimization of the area taken up by a single memory cell is critical in determining the size of the final memory device and hence in maximising performance and potential yield of the memory device.

The self alignment substantially eliminates the need for alignment tolerances which are required by the prior art. For example, EP-A-0192871 discloses a method of forming a polysilicon resistor in a polycide line in which a resistive region in a doped polysilicon layer is separated from an upper silicide layer, which forms polycide lines on either side of the resistive region, by a barrier layer of oxide. The method disclosed in EP-A-0192871 requires relatively large alignment tolerances in order accurately to locate the barrier oxide layer relative to the resistive region and thereby the polycide regions relative to the resistive region. In contrast, since the process of the present invention provides self alignment of the polycide regions relative to the load device, those tolerances can be reduced substantially so that the overall size of each load device can be reduced. Typically, the lift-off mask in the illustrated embodiment is 1.9 microns wide. Accordingly, the resultant resistor has a 20% linear shrinkage, and thereby takes up only 64% of the area, when compared to the resistor disclosed in EP-A-0192871. In addition, in the production of SRAM cells the market requires a standard cell size and aspect ratio and high memory capability in the memory device. The production of smaller devices leads to gains in performance and economic production. The production of load devices by silicide lift-off technique can overcome alignment constraints, both "internal" in relation to the other structures in the memory cell and "external" which relate the shape of the memory cell to the other devices in the semiconductor device.

A second advantage of the present invention is that the use of silicide lift-off permits load devices to be fabricated in a polycide cell, the polycide including silicide interconnect of low resistivity, without doping the underlying polysilicon with silicide contaminant in the areas where the load devices are to be fabricated. During deposition of the silicide to form the polycide stack structures, regions of the polysilicon are left free from deposited silicide so that the regions of polysilicon are not contaminated with silicide. Accordingly, the electrical conductivity in those regions is controlled entirely by the p- and n-dopant concentrations present in those regions which result from the implantation of those dopants and from any diffusion of dopants which has occurred.

A further advantage of the present invention is that a load device is formed employing only one layer of polysilicon and only one layer of silicide deposited thereover. This gives a structure with very high planarity, i.e. during the process of the invention the various parts of the memory cell substantially correspond in height. A planar structure has the advantage that during the various etching steps, those portions which are required to be etched in a given etching step are etched substantially to the same depth, so that it is much easier to achieve correct etching depths than in the prior art processes where it is often required to etch through a varying number of layers in a single etching step. If desired, the planarity can be enhanced by etching away the top surface of the polysilicon, during the etch step which is described with reference to FIG. 4. Furthermore, since the present invention employs the deposition of only one layer of silicide over a single layer of polysilicon using a lift-off technique, there is a high degree of shape uniformity over the memory cell, and the process of the present invention requires fewer masking steps than in the known process. In consequence, this can lead to increased productivity and a higher quality product.

What we claim is:

1. A semiconductor element incorporating a resistive device, the semiconductor element comprising a silicon substrate, superimposed layers of oxide and polysilicon on the substrate, the polysilicon having a resistive device formed therein from a first region of one conductivity type, and two second regions of opposite conductivity type which are adjacent the first region and boundaries between the first and second regions on respective sides of the first region, and two portions of a layer of silicide, each of which portions has been formed on a respective second region during a forming step, the said boundaries being located inwardly of the portions of formed silicide and having been positioned by diffusion at an elevated temperature of the impurity of opposite conductivity type from the second region into the first region, the first region having been masked both from an impurity of opposite conductivity type implanted into the second regions, and from the layer of silicide by a lift-off mask.

2. A semiconductor element incorporating a resistive device, the semiconductor element comprising a silicon substrate, superimposed layers of oxide and polysilicon on the substrate, the polysilicon having an impurity-doped first region of one conductivity type between two impurity-doped second regions of the other conductivity type thereby to form two spaced boundaries between the first and second regions, and two regions of silicide on the polysilicon, each silicide region being formed on a respective second region and being located outwardly away from the respective boundary thereby to form a resistive device between two areas of polysilicon in a polycide element.

3. A semiconductor element according to claim 2 wherein the one conductivity type is p-type and the other conductivity type is n-type.

4. A resistor formed in a polysilicon layer of a polycide element, the resistor comprising an impurity-doped first region in the polysilicon layer of one conductivity type, two impurity-doped second regions in the polysilicon layer of opposite conductivity type on opposed sides of the first region and two regions of silicide interconnect each of which is disposed on a respective second region of polysilicon and is spaced from the first region of polysilicon.

5. A resistor according to claim 4 wherein the one conductivity type is p-type and the other conductivity type is n-type.

* * * * *